(12) United States Patent
Wang et al.

(10) Patent No.: US 6,313,018 B1
(45) Date of Patent: Nov. 6, 2001

(54) PROCESS FOR FABRICATING SEMICONDUCTOR DEVICE INCLUDING ANTIREFLECTIVE ETCH STOP LAYER

(75) Inventors: Fei Wang; David K. Foote, both of San Jose; Myron R. Cagan, Saratoga; Subhash Gupta, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/504,449

(22) Filed: Feb. 16, 2000

Related U.S. Application Data

(62) Division of application No. 08/937,774, filed on Sep. 25, 1997, now Pat. No. 6,040,619.

(51) Int. Cl.$^7$ ................................................. H01L 21/20
(52) U.S. Cl. .................... 438/584; 438/637; 438/786; 257/632; 257/649; 257/703; 257/758
(58) Field of Search .................... 438/584, 637, 438/786; 257/649, 632, 703, 758

(56) References Cited

U.S. PATENT DOCUMENTS

| | | | | |
|---|---|---|---|---|
| 5,989,957 | * | 11/1999 | Ngo et al. | 438/257 |
| 6,040,619 | * | 3/2000 | Wang et al. | 257/649 |
| 6,051,870 | * | 4/2000 | Ngo | 257/519 |

* cited by examiner

*Primary Examiner*—David Nelms
*Assistant Examiner*—Reneé R. Berry

(57) ABSTRACT

A microelectronic device such as a Metal-Oxide-Semiconductor (MOS) transistor is formed on a semiconductor substrate. A tungsten damascene interconnect for the device is formed using an etch stop layer of silicon nitride, silicon oxynitride or silicon oxime having a high silicon content of approximately 40% to 50% by weight. The etch stop layer has high etch selectivity relative to overlying insulator materials such as silicon dioxide, tetraethylorthosilicate (TEOS) glass and borophosphosilicate glass (BPSG). The etch stop layer also has a high index of refraction and is anti-reflective, thereby improving critical dimension control during photolithographic imaging.

20 Claims, 9 Drawing Sheets

PROCESS FOR FABRICATING SEMICONDUCTOR DEVICE INCLUDING ANTIREFLECTIVE ETCH STOP LAYER

CROSS-REFERENCE TO RELATED APPLICATION

This application is a division of U.S. patent application Ser. No. 08/937,774, now U.S. Pat. No. 6,040,619 entitled "PROCESS FOR FABRICATING SEMICONDUCTOR DEVICE INCLUDING ANTIREFLECTIVE ETCH STOP LAYER", filed Sep. 25, 1997 by Fei Wang et al.

BACKGROUND OF THE INVENTION

1. Field of the Invention

The present invention generally relates to the art of microelectronic integrated circuits, and more specifically to a process for fabricating a semiconductor device including an antireflective etch stop layer.

2. Description of the Related Art

A semiconductor integrated circuit includes a large number of individual transistors and other microelectronic devices which must be interconnected to provide the desired functionality. A variety of interconnection techniques have been developed in the art.

Tungsten damascene is a process which includes forming an insulator layer of, for example, silicon dioxide over the microelectronic devices of an integrated circuit. A photoresist layer is formed over the insulator layer, and exposed and developed using photolithography to form a mask having holes therethrough in areas corresponding to desired interconnects.

The insulator layer is etched through the holes in the mask using Reactive Ion Etching (RIE) to form corresponding holes through the insulator layer down to interconnect areas (source, drain, metallization, etc.) of the devices. The holes are filled with tungsten which ohmically contacts the interconnect areas to form local interconnects, self-aligned contacts, vertical interconnects (vias), etc.

Etching of the insulator layer is conventionally performed using octafluorobutene ($C_4F_8$) etchant, which also has a high etch rate for silicon. For this reason, a mechanism must be provided to perform this etch without allowing the etchant to act on the silicon of underlying interconnect areas.

Such a mechanism includes forming an etch stop layer of, for example, silicon nitride or silicon oxynitride underneath the insulator layer, and performing the etch in two stages. The first stage is the octafluorobutene etch through the insulator layer, which terminates at the etch stop layer since octafluorobutene has a relatively low etch rate for the etch stop layer. Then, a second RIE etch is performed using fluoromethane ($CH_3F$), which forms holes through the portions of the etch stop layer that are exposed through the holes in the insulator layer, down to the interconnect areas of the devices. This is possible because fluoromethane has a high etch rate for the etch stop layer, but a low etch rate for silicon dioxide.

The structure can be further facilitated by using a silicide technique to increase the conductivity of the interconnect areas of the devices. Siliciding is a fabrication technique that enables electrical interconnections to be made that have reduced resistance and capacitance.

The silicide process comprises forming a layer of a refractory metal silicide material such as tungsten, titanium, tantalum, molybdenum, etc. on a silicon interconnect area (source or drain diffusion region) or on a polysilicon gate to which ohmic contact is to be made, and then reacting the silicide material with the underlaying silicon material to form a silicide surface layer having much lower resistance than heavily doped silicon or polysilicon. A silicide surface layer formed on a polysilicon gate is called "polycide", whereas a silicide surface layer formed on silicon using a self-aligned process is called "salicide".

A problem which has remained unsolved in the fabrication of semiconductor integrated circuits using reactive ion etching and a conventional etch stop layer is relatively low selectively. This refers to the rate at which the etch stop layer is etched relative to the rate at which the overlying silicon dioxide insulator layer is etched. Conventional etch stop materials have relatively low selectivities, on the order of 8:1, which make it difficult to accurately end the etching process.

If the octafluorobutene etching is stopped too soon, the silicon dioxide insulator layer will not be etched through completely. In this regard, it is generally necessary to perform overetching in order to ensure the formation of a vertical hole wall through the insulator material. If the etching is stopped too late, the etch stop layer can be etched through and a portion of the underlying silicon layer damaged by undesired etching.

SUMMARY OF THE INVENTION

The present invention overcomes the drawbacks of the prior 10 art by fabricating a semiconductor device using Reactive Ion Etching in combination with an etch stop layer to form tungsten damascene interconnects. The etch stop layer is formed of silicon nitride, silicon oxynitride or silicon oxime having a high silicon content of approximately 40% to 50% by weight.

The etch stop layer has high etch selectivity relative to overlying insulator materials such as silicon dioxide. The etch stop layer also has a high index of refraction and is anti-reflective, thereby improving critical dimension control during photolithographic imaging.

More specifically, a semiconductor structure according to the present invention includes a semiconductor substrate, a semiconductor device formed on a surface of the substrate, and an etch stop layer of a material selected from the group consisting of silicon nitride, silicon oxynitride and silicon oxime formed over the surface of the substrate and the device. The etch stop layer has a silicon content of approximately 40% to 50% by weight.

The device has an interconnect area. The structure further includes an insulator layer formed over the etch stop layer, a first hole formed through the insulator layer to the etch stop layer in alignment with the interconnect area, and a second hole formed through the etch stop layer to the interconnect area. An electrically conductive material fills the first and second holes and ohmically contacts the interconnect area to form an interconnect.

These and other features and advantages of the present invention will be apparent to those skilled in the art from the following detailed description, taken together with the accompanying drawings, in which like reference numerals refer to like parts.

DETAILED DESCRIPTION OF THE INVENTION

FIGS. 1a to 1j are simplified sectional diagrams illustrating a process for fabricating a semiconductor device according to the present invention. The detailed configuration of the device is not the particular subject matter of the invention, and only those elements which are necessary for understanding the invention will be described and illustrated.

Figure 1A:
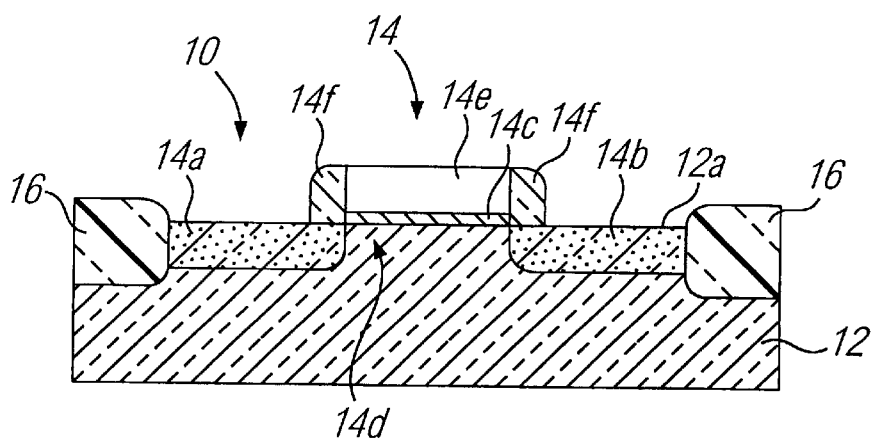
FIGS. 1a to 1j are simplified sectional views illustrating steps of a process for fabricating a semiconductor device including a local interconnect according to the present invention.

As viewed in FIG. 1a, a semiconductor structure 10 includes a silicon or other semiconductor substrate 12. A microelectronic device such as a Metal-Oxide-Semiconductor (MOS) transistor 14 is formed on a surface 12a of the substrate 12, including a source 14a, a drain 14b, a gate oxide layer 14c, and a channel 14d underlying the gate oxide layer 14c. A polysilicon gate 14e is formed over the gate oxide layer 14c. Sidewall spacers 14f are formed at the opposite ends of the gate 14e. The transistor 14 is physically and electrically isolated from other devices by field oxide regions 16.

The detailed configuration and operation of the transistor 14 are not the particular subject matter of the invention and will not be described in detail. Furthermore, the reference numerals designating the individual elements of the transistor 14 will be omitted in the remaining drawings to avoid cluttering unless necessary for understanding of the invention.

FIG. 1a illustrates the initial steps of a process according to the present invention, which consist of providing the substrate 12, and forming semiconductor devices such as the transistor 14 on the surface 12a of the substrate 12.

Figure 1B:
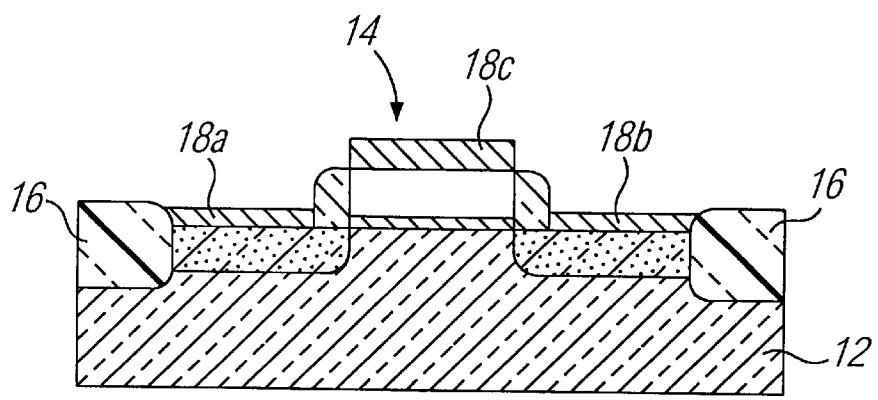

FIG. 1b shows how an interconnect is formed for the transistor 14 using a silicide technique to increase the electrical conductivity. The process comprises forming a layer of a refractory metal silicide material such as tungsten, titanium, tantalum, molybdenum, etc. on the source 14a, drain 14b, and gate 14e to which ohmic contact is to be made, and then reacting the silicide material with the underlaying silicon material to form a silicide source interconnect area 18a, a drain interconnect area 18b, and a gate interconnect area 18c.

Figure 1C:
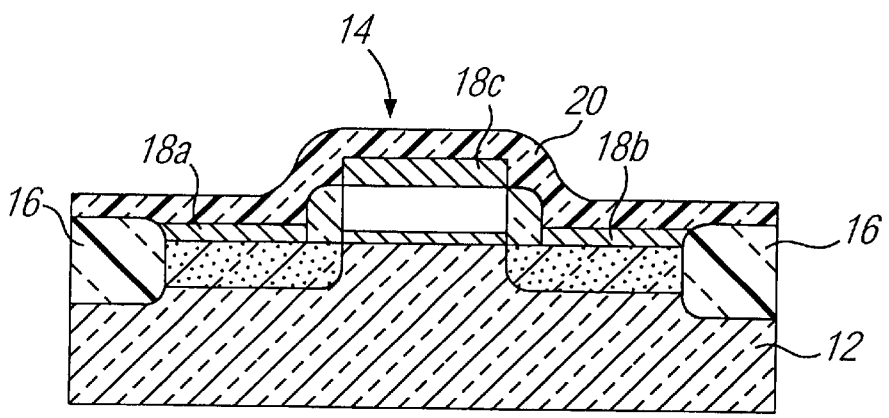

FIG. 1c illustrates how an etch stop layer 20 of silicon nitride ($Si_{3}N_{4}$:H), silicon oxynitride (SiON:H) or silicon oxime (SiNO:H) is formed over the surface 12a of the substrate 12 and the transistor 14 in accordance with the present invention. The "H" in the formulas indicates that the layer 20 includes a residual amount of hydrogen.

Figure 2:
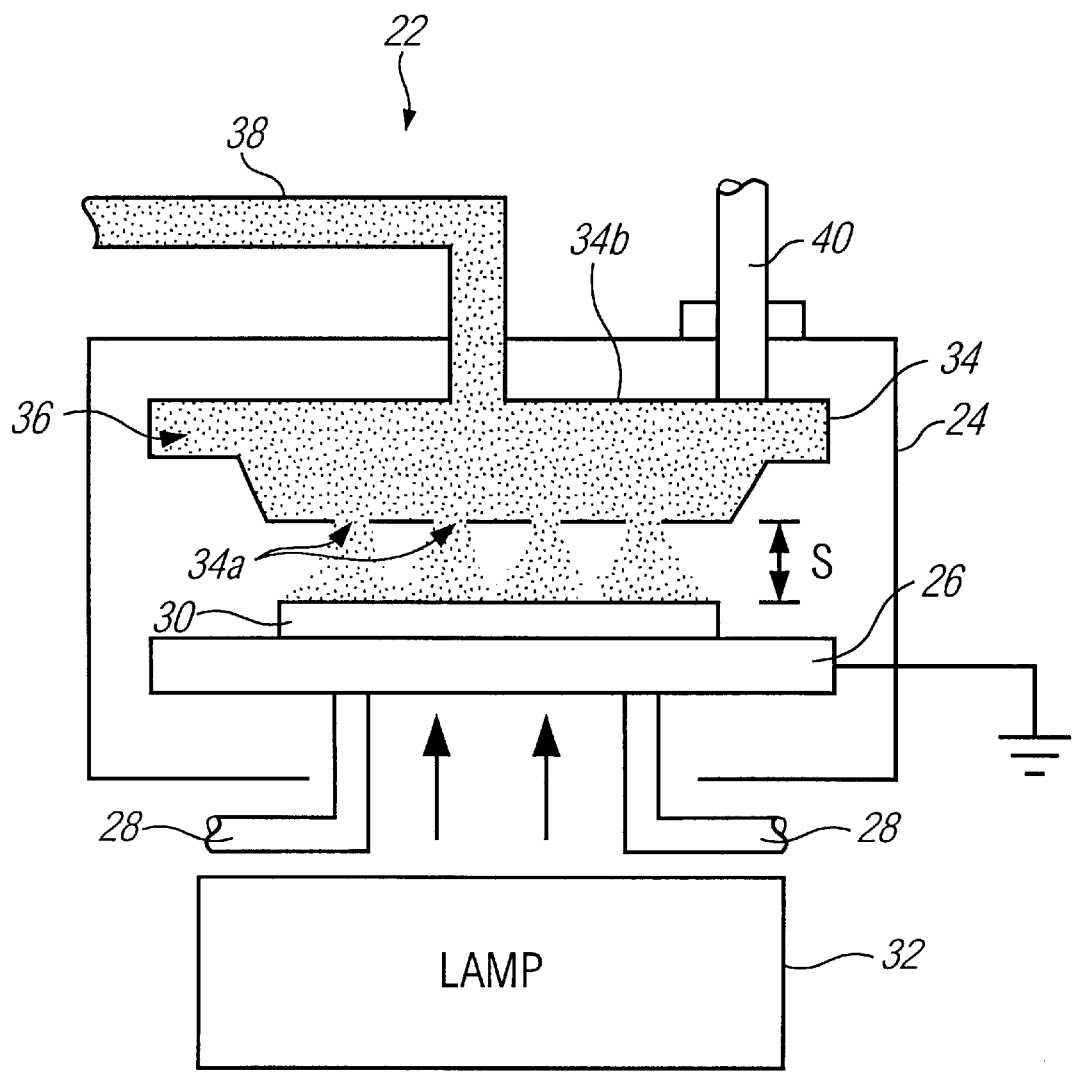
FIG. 2 is a simplified diagram illustrating a Plasma Enhanced Chemical Vapor Deposition (PECVD) apparatus for practicing the present invention.

A PECVD reaction chamber 22 for forming the etch stop layer 20 is illustrated in FIG. 2, and inclues a container 24.

An electrically grounded susceptor 26 is suspended in the container 24. A silicon wafer 30 including one or more dies on which semiconductor structures 10 are formed is supported on the susceptor 26. Lift pins 28 are provided for placing the wafer 30 on the susceptor 26. The wafer 30 is heated to a temperature of approximately 400° C. by a lamp 32.

A gas discharge nozzle which is known in the art as a shower head 34 is mounted in the container 24 above the wafer 30. A gas mixture 36 which is used to form the silicon oxynitride layer 20 is fed into the shower head 34 through an inlet conduit 38 and discharged downwardly toward the wafer 30 through orifices 34a. The gas 36 preferably includes silane ($SiH_4$), nitrous oxide ($N_2O$) and nitrogen ($N_2$).

Radio Frequency (RF) power is applied to the shower head 34 through a power lead 40. A blocker plate 34b is provided at the upper end of the shower head 34 to prevent gas from escaping upwardly.

The RF power applied to the shower head 34 creates an alternating electrical field between the shower head 34 and the grounded susceptor 26 which forms a glow or plasma discharge in the gas 36 therebetween. The plasma discharge enables the etch stop layer 20 to be formed at the temperature specified above.

The PECVD deposition parameters are selected in accordance with the present invention to make the etch stop layer 20 layer silicon rich, more specifically having a silicon content of approximately 40% to 50% by weight. This is accomplished by providing the gas 36 with a high concentration of silane relative to nitrogen. Specific examples of deposition parameters for commercially available PECVD chambers will be presented below.

Figure 1D:
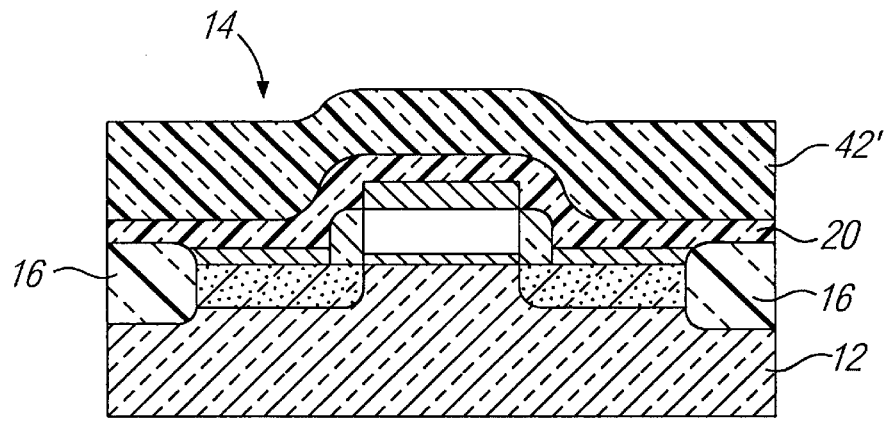
Figure 1E:
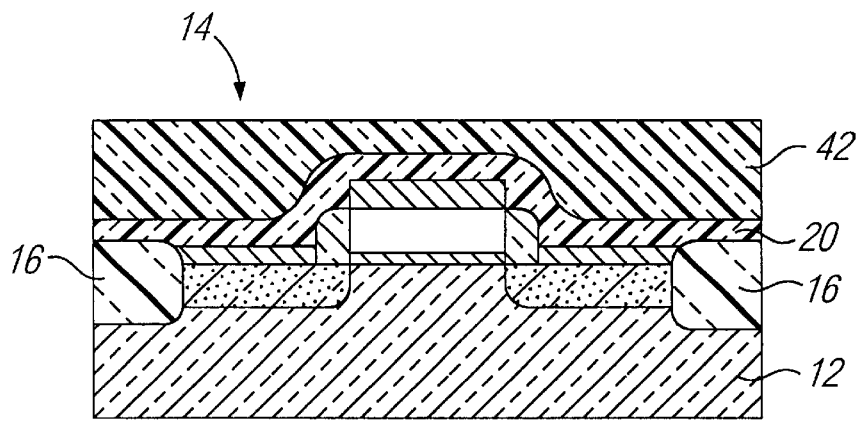

Referring now to FIG. 1d, the next step of the process is to form an insulator layer 42' over the etch stop layer 20. The insulator layer 42' is preferably formed of silicon dioxide, but can also be formed of other suitable materials including tetraethylorthosilicate (TEOS) glass, phosphosilicate glass (PSG) and borophosphosilicate glass (BPSG). The insulator layer 42' is planarized as illustrated in FIG. 1e using, preferably, chemical-mechanical polishing, and redesignated as 42.

The remaining steps result in the formation of a tungsten damascene local interconnect for the memory 10. In the illustrated example, a local interconnect is formed which connects the gate 14e to the drain 14b of the transistor 14 via the silicide interconnect areas 18c and 18b respectively. However, the invention is not so limited, and can be used to form any appropriate type of interconnect.

Figure 1F:
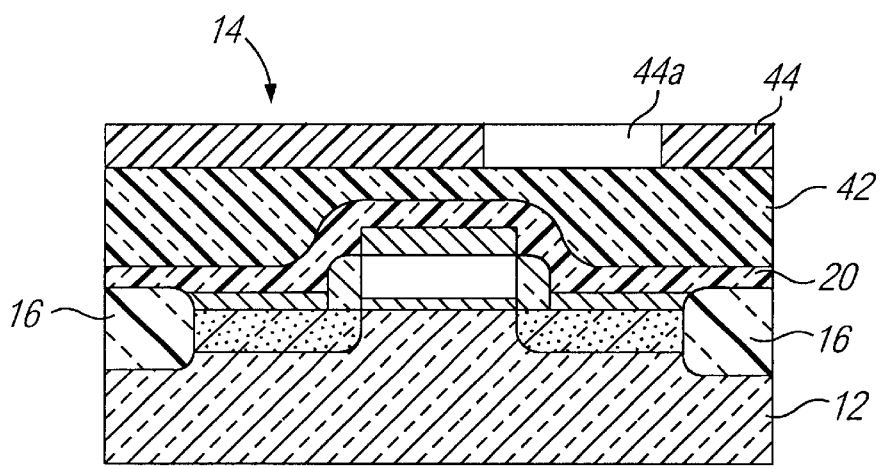
Figure 1G:
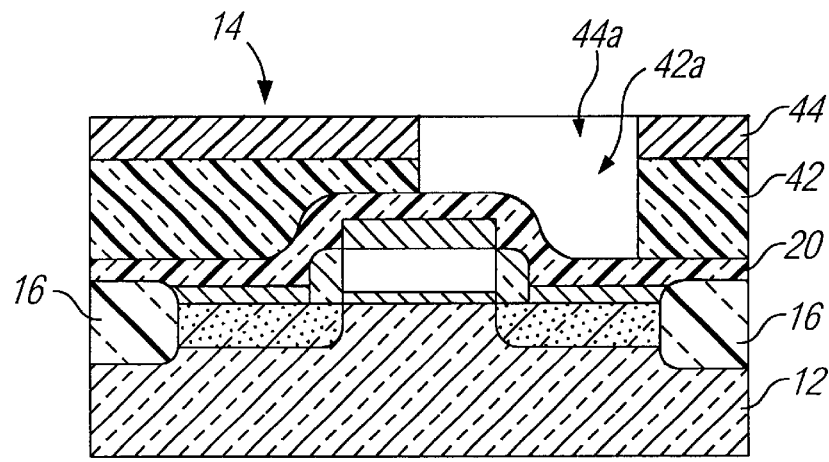
Figure 1H:
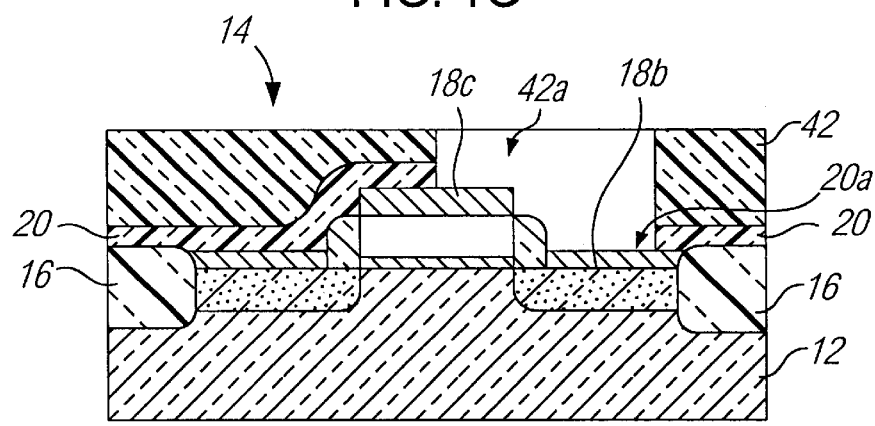

In FIG. 1f, a layer of photoresist 44 is formed on the insulator layer 42, and patterned using photolithography such that a hole 44a is formed which spans the silicide interconnect areas 18b and 18c. In FIGS. 1g and 1h, holes are etched through the insulator layer 42 and the etch stop layer 20 down to the interconnect areas 18b and 18c, preferably using a two stage Reactive Ion Etching (RIE) process.

In FIG. 1g, an RIE etch is performed using octafluorobutene ($C_4F_8$) or other suitable etchant which has a selectively high etch rate for the insulator layer 42 and a low etch rate for the etch stop layer 20. This results in the formation of a vertical hole 42a which extends downwardly from the hole 44a of the photoresist layer 44 through the insulator layer 42 and stops on the etch stop layer 20 in alignment with corresponding portions of the interconnect areas 18b and 18c.

In FIG. 1h, the photoresist layer 44 is stripped away, and a second RIE etch is performed using fluoromethane (CH$_3$F) or other suitable etchant which has a selectively high etch rate for the etch stop layer 20 and a low etch rate for the insulator layer 42. This results in the formation of a hole 20a through the etch stop layer 20. The hole 20a is an extension of the hole 42a through the insulator layer 42, and terminates at the interconnect areas 18b and 18c.

Figure 1I:
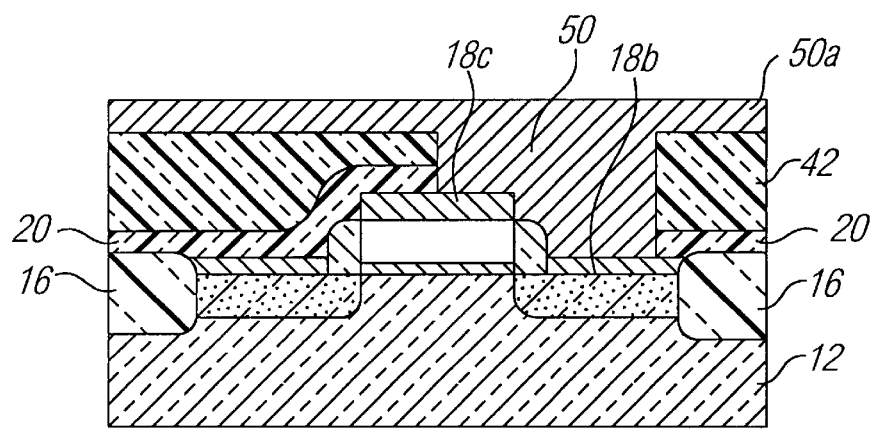

In FIG. 1i, tungsten 50 is deposited over the structure of FIG. 1h. The tungsten 50 fills the holes 42a and 20a through the insulator layer 42 and the etch stop layer 20, and ohmically contacts the interconnect areas 18b and 18c. The tungsten 50 further forms on the top of the insulator layer 42 as indicated at 50a.

Figure 1J:
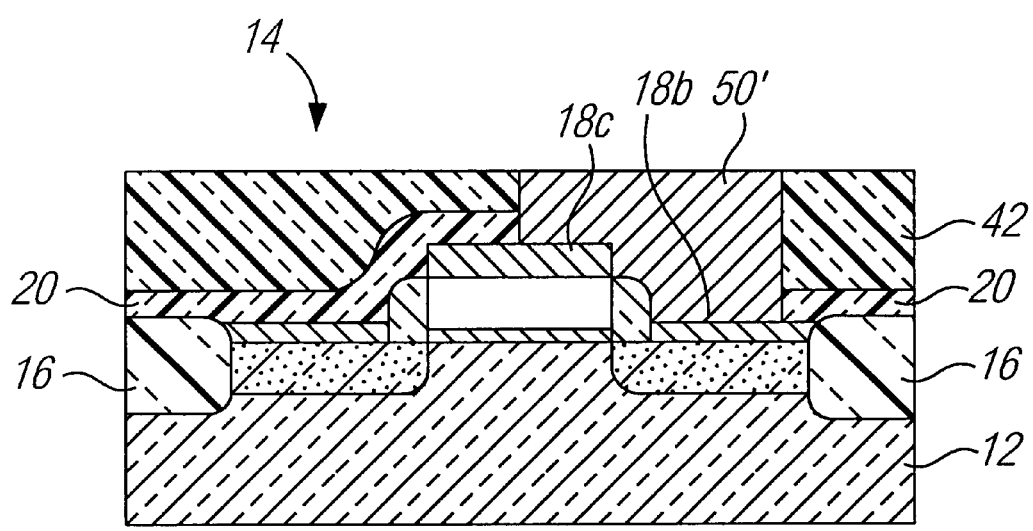

In FIG. 1j, the top of the structure is planarized, preferably using chemical-mechanical polishing, to remove the tungsten 50a from the insulator layer 42. The result is a local interconnect 50' which is formed of tungsten inlaid in the insulator layer 42 and the etch stop layer 20. The local interconnects 50' interconnects the gate 14e and the drain 14b of the transistor 14 via the silicide interconnect areas 18c and 18b respectively.

An etch stop layer 20 formed in accordance with the present invention has a high silicon content, on the order of 40% to 50% by weight, with the optimal value being near the center of this range. The present inventors have discovered that this level of silicon, content substantially increases the selectivity of the present etch stop layer over conventional etch stop layer materials which are used in the prior art. Selectivities in excess of 30:1 have been achieved in accordance with the present invention, as compared to a typical prior art value of 8:1.

In addition, the inventors have discovered that the present etch stop layer has a high index of refraction in the range of 1.2 to 2.7, with an optimal value being near the center of this range. This increases the opacity of the present etch stop layer over prior art materials, and provides the present etch stop layer 20 with an anti-reflective property.

More specifically, internal reflections from features of microelectronic devices that are not perpendicular to photolithographic imaging light during an imaging step can degrade critical dimension control (the dimensional tolerance of a shape being formed by photolithography). Conventional etch stop layers themselves create such reflections and, although performing their intended function during the interconnect etching steps as described above, are detrimental to resolution and critical dimension control.

The present etch stop layer not only has increased etch selectivity over prior art etch stop layer materials, but is anti-reflective. Thus, the present invention provides a dual improvement over the prior art.

Preferred examples of process conditions for forming a silicon oxime etch stop layer in a PECVD reactor such as illustrated in FIG. 2 will be presented below. In EXAMPLE I the reactor is an AMT5000 model which is commercially available from Applied Materials Corporation of Santa Clara, Calif. In EXAMPLE II the reactor is a Novellus Concept I System model which is commercially available from Novellus Systems, Inc. of San Jose, Calif.

It will be understood that these conditions are exemplary only, and that the conditions for forming these layers in a different model or type of reactor can differ substantially. The process conditions for forming an etch stop layer of silicon oxynitride and silicon nitride can also differ substantially.

EXAMPLE I (Applied Materials AMT5000)

The etch stop layer 20 is formed under the following conditions, all of which are variable from the listed values by approximately ±10%.

Silane (SiH$_4$) flow rate: 115 sccm

Nitrogen (N$_2$) flow rate: 550 sccm

Nitrous oxide (N$_2$O) flow rate: 41 sccm

Pressure: 3.5 torr

RF power: 325 watts

Temperature: 400° C.

Processing time: 10 seconds (for 800 angstrom thickness)

Spacing (S in FIG. 2) between shower head 34 and surface of wafer 30: 360 mils (9.14 millimeters)

Layer thickness: 800 angstroms

EXAMPLE II (Novellus Concept I System)

The etch stop layer 20 is formed under the following conditions, all of which are variable from the listed values by approximately ±10%.

Silane (SiH$_4$) flow rate: 287 sccm

Nitrogen (N$_2$) flow rate: 4,000 sccm

Nitrous oxide (N$_2$O) flow rate: 160 sccm

Pressure: 3.0 torr

RF power: 250 watts (HF), 210 watts (LF)

Temperature: 400° C.

Processing time: 5.5 seconds

Soaktime (temperature ramp-up time): 30 seconds

Spacing (S in FIG. 2) between shower head 34 and surface of wafer 30: 550 mils (13.97 millimeters)

Layer thickness: 800 angstroms

Although FIGS. 1a to 1j illustrate the formation of a local interconnect, the invention is not so limited. An etch stop layer according to the invention can be used to form different types of interconnects such as will be described below.

FIGS. 3a to 3e illustrate how a self-aligned contact (SAC) can be formed in accordance with the invention. In this example, an SAC will be formed which ohmically contacts the silicide interconnect area 18b overlying a common drain 14b between two laterally spaced transistors 14 for external interconnection from above.

Figure 3A:
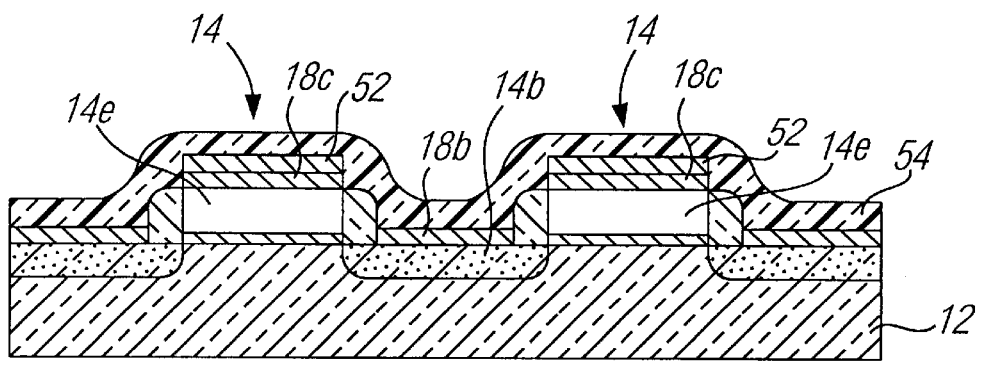
FIGS. 3a to 3e are similar to FIGS. 1a to 1j, but illustrate fabrication of a device including a self-aligned contact.

In FIG. 3a, a first etch stop layer 52 is selectively formed over the silicide interconnect areas 18c on the gates 14e of the transistors 14. Then, a second etch stop layer 54 is formed over the first etch stop layer 52 and the exposed portions of the transistors 14. The purpose of the first etch stop layer 52 is to make the total etch stop layer thickness larger over the gates 14e of the transistors 14 than over the common drain 14b.

Figure 3B:
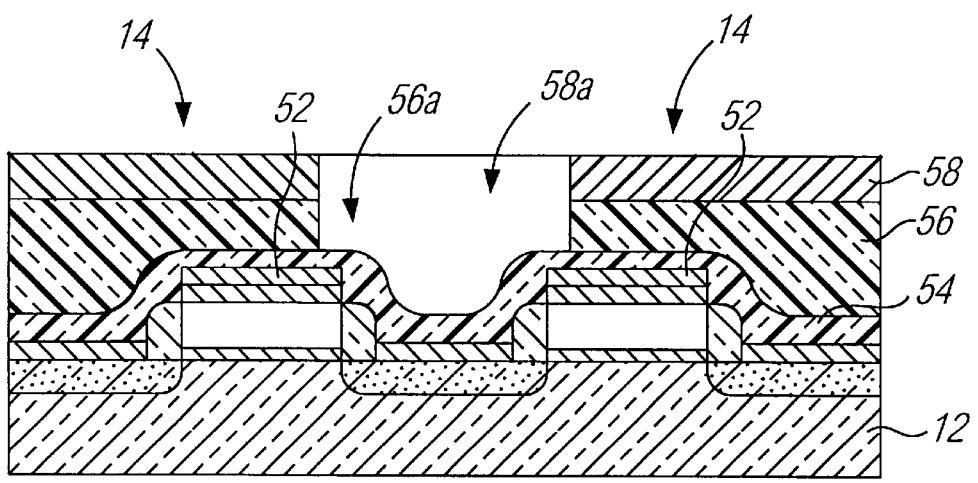

As illustrated in FIG. 3b, an insulator layer 56 and a photoresist layer 58 are formed over the structure. The photoresist layer 58 is photolithographically imaged and developed to form a hole 58a, and the underlying insulator layer 56 is etched down to the etch stop layer 54 using octafluorobutene to form a hole 56a in the manner described above with reference to FIGS. 1a to 1j. The holes 56a and 58a overlie the common drain 14b and adjacent portions of the gates 14e of the transistors 14.

Figure 3C:
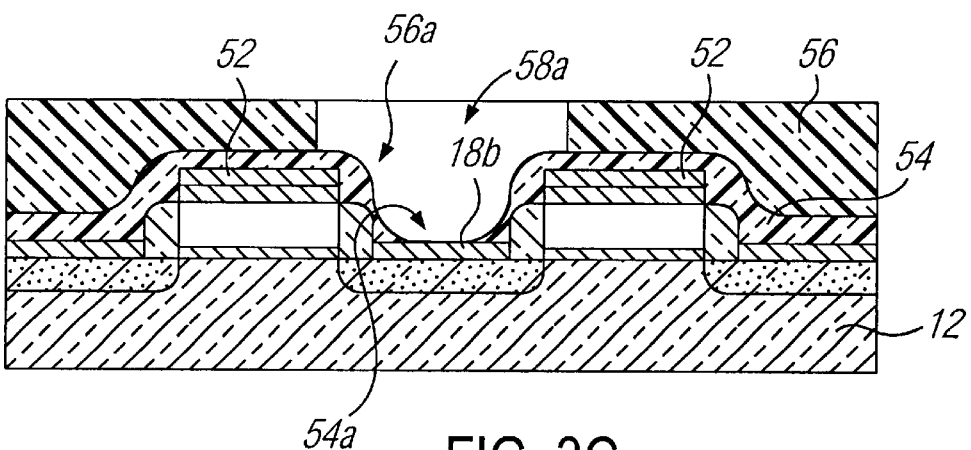

In the step of FIG. 3c, the etch stop layer 54 is etched using fluoromethane to form a hole 54a which extends down to the silicide interconnect area 18b on the drain 14b. Although portions of the layer 54 that are formed over the gates 14e are partially etched away, the gates 14e are protected because the combined thickness of the etch stop layers 52 and 54 is larger in these areas.

The etching is performed for a length of time such that the portion of the layer 54 which overlies the drain 14b is etched away to expose the underlying interconnect area 18b, but insufficient etch stop material is removed from the areas above the gates 14e to expose the gates 14e. In this manner, the hole 54a is formed in a self-aligned manner, without requiring any patterning steps.

Figure 3D:
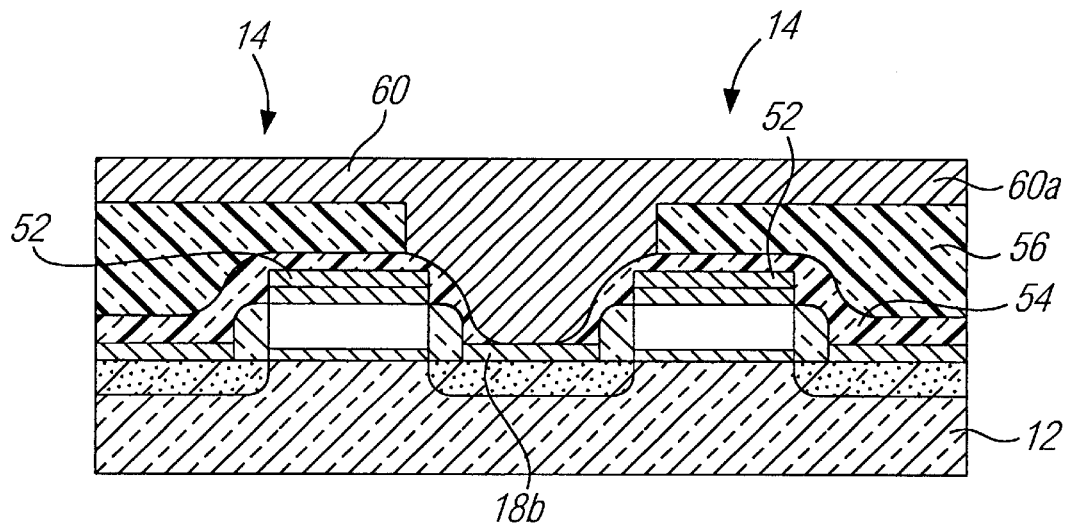
Figure 3E:
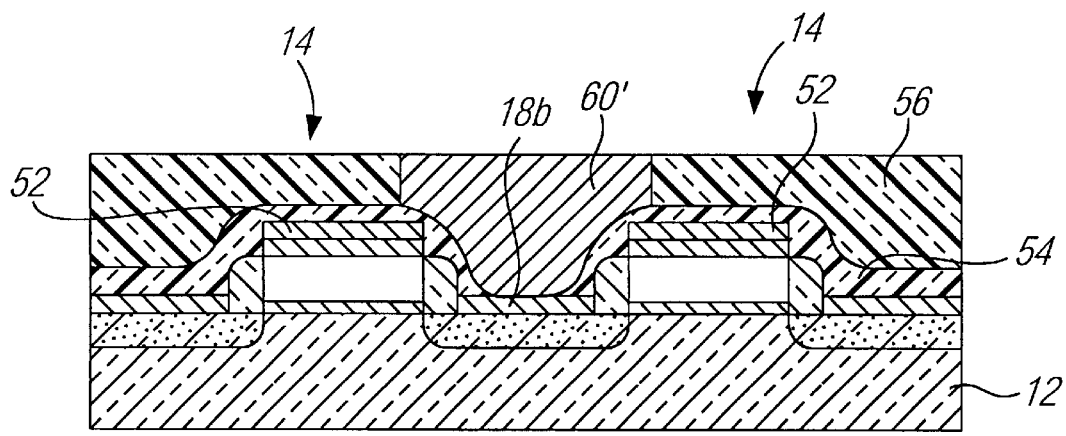

In FIG. 3d, tungsten 60 is formed over the structure to fill the holes 54a, 56a and 58a and ohmically contact the silicide interconnect area 18b, and in FIG. 3e the structure is planarized to remove an upper tungsten area 60a and produce a self-aligned contact 60' for external interconnection of the drain 18b.

Figure 4:
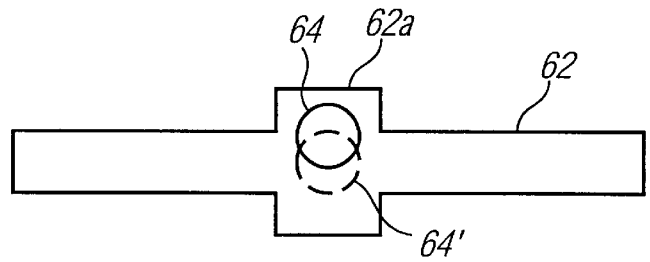
FIG. 4 is a diagram illustrating a conventional vertical interconnect arrangement.

The present invention can also be advantageously applied for forming vertical interconnects (vias) for external interconnection to buried metallization lines. FIG. 4 illustrates a conventional metallization line (aluminum, etc.) 62 which is formed with an enlarged interconnect area 62a. Interconnection to the line 62 is made by vias which extend downwardly through overlying insulator layers. The vias are formed by etching holes using RIE, and filling the holes with tungsten or other suitable metal as described above.

The enlarged area 62a is provided to accommodate misalignment in forming an interconnecting via. Such a case is illustrated in FIG. 4 as including a via hole 64 which is offset due to misalignment from its intended centered position as indicated in broken line at 64'.

Figure 5:
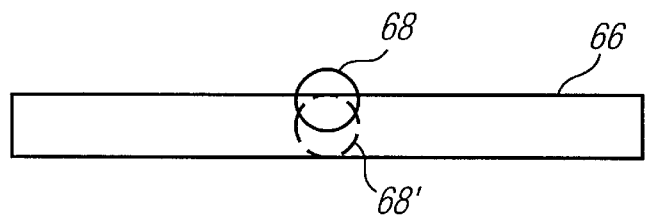
FIG. 5 is similar to FIG. 4, but illustrates a borderless vertical interconnect arrangement.

FIG. 5 illustrates a "borderless" metallization line 66 which is not formed with an enlarged area to accommodate via misalignment. As illustrated, a via hole 68 is formed in misalignment with the line 66, being offset from an intended position 68'. A via formed by filling the hole 68 with metal will be functional since the via will make ohmic contact with the line 66, but only over a portion of its cross-sectional area.

Figure 6A:
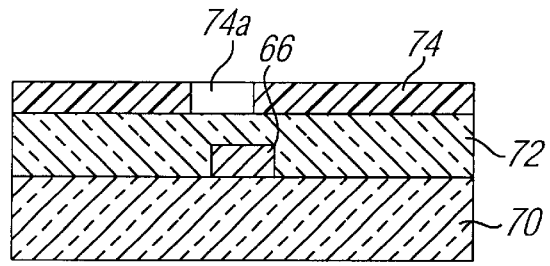
FIGS. 6a and 6b illustrate a detrimental effect of interconnect misalignment without the use of an etch stop layer.
Figure 6B:
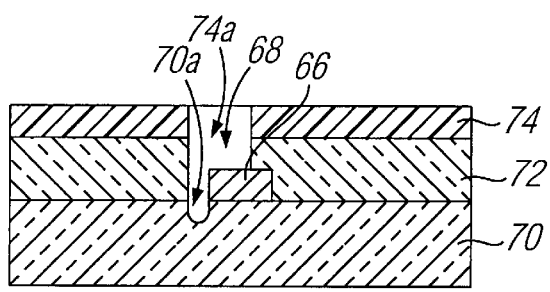

FIGS. 6a and 6b illustrate how a semiconductor structure can be damaged due to via misalignment with the borderless line 66 illustrated in FIG. 5. In the drawings, the line 66 is formed on a semiconductor substrate 70, and an insulator layer 72 is formed over the surface of the substrate 70 and the line 66. A photoresist layer 74 is formed over the insulator layer 72 and patterned with a hole 74a for a via. The hole 74a is misaligned with the line 66 in the manner illustrated in FIG. 5.

In FIG. 6b, the insulator layer 72 is etched down to the line 66 using octafluorobutene to form the via hole 68. However, due to misalignment of the hole 68 and line 66, a portion of the insulator layer 72 which underlies the hole 68 and is laterally adjacent to the line 66 is also etched away, as well as a portion of the underlying substrate 70 as indicated at 70a. This undesired etching of the substrate 70 constitutes damage which can result in a variety of problems.

Figure 7A:
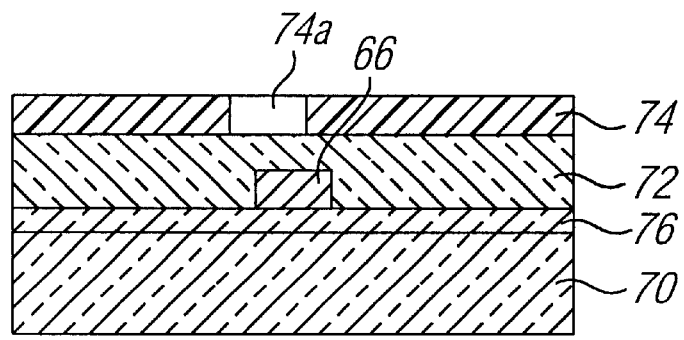
FIGS. 7a to 7c illustrate formation of a borderless vertical interconnect using an etch stop layer according to the present invention.
Figure 7B:
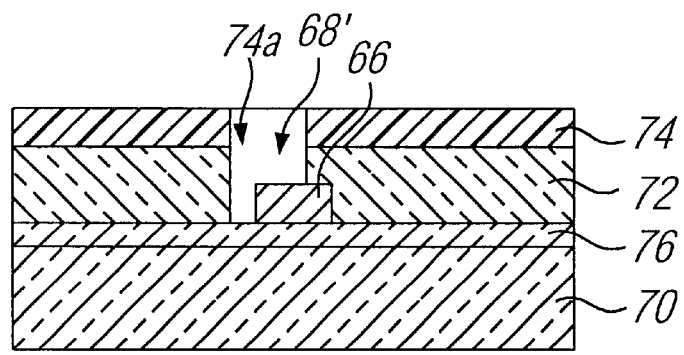
Figure 7C:
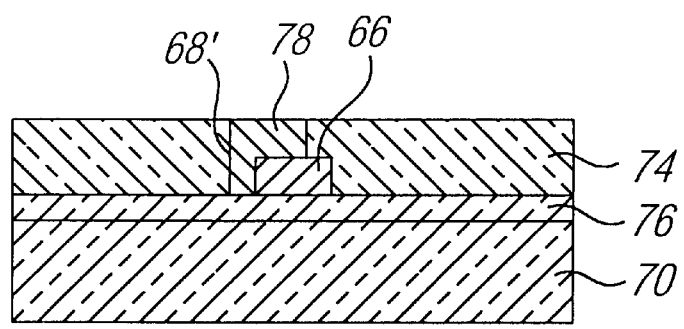

FIGS. 7a to 7c illustrate how this problem is overcome using a high selectivity etch stop layer in accordance with the present invention. As illustrated in FIG. 7a, an etch stop layer 76 is formed between the substrate 70 and the insulator layer 72. In FIG. 7b, a via hole 68' is etched in the manner described above with reference to FIG. 6b. However, the substrate 70 is not damaged because the etchant is prevented from reaching the substrate 70 by the etch stop layer 76.

FIG. 7c illustrates a via 78 formed in the hole 68' by tungsten deposition and planarization as described above. In this manner, an etch stop layer according to the present invention enables via misalignment to be tolerated in a configuration using borderless metallization lines.

In summary, the present invention overcomes the drawbacks of the prior art by providing an etch stop layer which has a high etch selectivity relative to overlying insulator materials such as silicon dioxide. The etch stop layer also has a high index of refraction and is anti-reflective, thereby improving critical dimension control during photolithographic imaging.

Various modifications will become possible for those skilled in the art after receiving the teachings of the present disclosure without departing from the scope thereof.

We claim:

1. A process for fabricating a semiconductor structure having an interconnect, comprising the steps of:
    (a) providing a semiconductor substrate;
    (b) forming a semiconductor device having an interconnect area on a surface of the substrate;
    (c) forming an etch stop layer of a material selected from the group consisting of silicon nitride, silicon oxynitride and silicon oxime over the surface of the substrate and the device, the etch stop layer having a silicon content of approximately 40% to 50% by weight;
    (d) forming an insulator layer over the etch stop layer;
    (e) etching a first hole through the insulator layer to the etch stop layer in alignment with the interconnect area;
    (f) etching a second hole through the etch stop layer to the interconnect area; and
    (g) filling the first and second holes with an electrically conductive material which ohmically contacts the interconnect area to form the interconnect.

2. A process as in claim 1, in which step (e) comprises etching the first hole using Reactive Ion Etching (RIE) with octafluorobutene.

3. A process as in claim 1, in which step (f) comprises etching the second hole using Reactive Ion Etching (RIE) with fluoromethane.

4. A process as in claim 1, in which:
    step (a) comprises providing the substrate of silicon; and
    step (b) comprises the substeps of:
        (b1) forming a layer of a refractory metal silicide material over the interconnect area; and
        (b2) reacting the silicide material with underlying silicon to form the interconnect area as a silicide.

5. A process as in claim 1, in which step (g) comprises filling the first and second holes with tungsten to form the interconnect as a tungsten damascene.

6. A process as in claim 1, in further comprising the step, performed between steps (d) and (e), of:
    (h) planarizing the insulator layer using chemical mechanical polishing.

7. A process as in claim 1, in which step (d) comprises forming the insulator layer of a material selected from the group consisting of silicon dioxide, tetraethylorthosilicate (TEOS) glass, phosphosilicate glass (PSG) and borophosphosilicate glass (BPSG).

8. A process as in claim 1, in which step (c) comprises forming the etch stop layer at a temperature of approximately 400° C. ±10%.

9. A process as in claim 8, in which:
    step (c) comprises forming the etch stop layer of silicon oxime using Plasma Enhanced Chemical Vapor Deposition (PECVD) with:
        an $SiH_4$ flow rate of approximately 115 sccm ±10%; and
        an RF power of approximately 345 watts ±10%.

10. A process as in claim 9, in which step (c) further comprises forming the etch stop layer with an $N_2O$ flow rate of approximately 41 sccm ±10%, and an $N_2$ flow rate of approximately 550 sccm ±10%.

11. A process as in claim 9, in which step (c) further comprises forming the etch stop layer at a pressure of approximately 3.5 torr ±10%.

12. A process as in claim 9, in which step (c) further comprises forming the etch stop layer with a spacing between a PECVD shower head and the surface of the substrate of approximately 9.14±10% millimeters.

13. A process as in claim 1, in which step (c) comprises forming the etch stop layer to a thickness of approximately 800 Å ±10%.

14. A process for fabricating a semiconductor structure, comprising the steps of:

(a) providing a semiconductor substrate;

(b) forming a semiconductor device on a surface of the substrate; and (c) forming a layer of a material selected from the group consisting of silicon nitride, silicon oxynitride and silicon oxime over the surface of the substrate and the device, the layer having a silicon content of approximately 40% to 50% by weight.

15. A process as in claim 14, in which step (c) comprises forming the layer at a temperature of approximately 400° C. ±10%.

16. A process as in claim 15, in which:

step (c) comprises forming the layer of silicon oxime using Plasma Enhanced Chemical Vapor Deposition (PECVD) with:

an $SiH_4$ flow rate of approximately 115 sccm ±10%; and an RF power of approximately 345 watts ±10%.

17. A process as in claim 16, in which step (c) further comprises forming the layer with an $N_2O$ flow rate of approximately 41 sccm ±10%, and an $N_2$ flow rate of approximately 550 sccm ±10%.

18. A process as in claim 16, in which step (c) further comprises forming the layer at a pressure of approximately 3.5 torr ±10%.

19. A process as in claim 16, in which step (c) further comprises forming the layer with a spacing between a PECVD shower head and the surface of the substrate of approximately 9.14±10% millimeters.

20. A process as in claim 14, in which step (c) comprises forming the layer to a thickness of approximately 800 Å ±10%.

* * * * *